United States Patent [19]
Li

[11] Patent Number: 5,929,494
[45] Date of Patent: Jul. 27, 1999

[54] READ ONLY MEMORY ARRAY AND METHOD OF MANUFACTURING THE ARRAY

[75] Inventor: Che Chung Roy Li, Tseung Kwan, The Hong Kong Special Administrative Region of the People's Republic of China

[73] Assignee: Motorola, Inc., Schaumburg, Ill.

[21] Appl. No.: 08/954,386

[22] Filed: Oct. 20, 1997

[30] Foreign Application Priority Data

Nov. 29, 1996 [SG] Singapore ............................. 9611480

[51] Int. Cl.⁶ .................................................. H01L 29/76
[52] U.S. Cl. ........................................ 257/390; 257/391
[58] Field of Search ................................... 257/390, 391; 438/276; 365/103, 104

[56] References Cited

U.S. PATENT DOCUMENTS 5,526,306  6/1996  Hikawa et al. ......................... 257/390
5,590,068 12/1996  Bergemont ............................. 365/63

*Primary Examiner*—Tom Thomas
*Assistant Examiner*—Ori Nadav
*Attorney, Agent, or Firm*—Rennie William Dover

[57] ABSTRACT

A compact ROM array is formed in a single active region (5) bounded by field oxide regions, the array being formed of one or more ROM banks (6, 7). Each ROM bank has a plurality of pairs of N+ bit lines (1-1 to 4-2), a plurality of conductive word lines (15-1 to 16-2) formed on top of, and perpendicular to, the bit lines, and left-select (11) and right-select (12-1, 12-2) lines arranged parallel to the word lines to enable particular transistor cells in the array to be selected to be read. The transistor cells (40, 41) are formed by adjacent portions of adjacent bit lines together with the portion of the word line extending between them. Isolation regions (43) between the transistor cells are formed by implanting the substrate between them with Boron dopant of a low energy and concentration after the bit and word lines have been fabricated and the transistor cells are programmed by implanting a channel region (42) with Boron of a higher energy and concentration after the low energy implantation step.

16 Claims, 5 Drawing Sheets

READ ONLY MEMORY ARRAY AND METHOD OF MANUFACTURING THE ARRAY

FIELD OF THE INVENTION

This invention relates to a Read Only Memory (ROM) array and to a method of manufacturing such an array, which can be used either integrated on a single semiconductor chip with a microprocessor to form a microcontroller, or in stand alone memory devices, or, indeed, as part of any electronic chip that requires ROM.

BACKGROUND OF THE INVENTION

As electronic devices and apparatus using such devices become more and more complicated and/or "user-friendly", they require larger and larger amounts of memory in order to store the software necessary for them to function as desired. Accordingly, either the number of blocks of ROM on a particular chip need to increase, which increases the chip cost and size thereby reducing the manufacturing yield, or extra memory chips must be provided in the apparatus.

There is therefore a need for memory arrays which have a structure allowing the memory cells, formed of individual MOS transistors, to be arranged as densely as possible in the array, so as to increase the data storage capacity of a given area on a semiconductor chip.

A number of solutions to try to increase the cell density of ROM have been proposed. In European Patent Application EP 0109853, published May 30, 1985, there is described an array of MOS transistors formed in a semiconductor substrate having a plurality of continuous diffused lines (bit lines), with alternate diffused lines serving, respectively, as the source and drain regions of a number of the MOS transistors. A plurality of conductive word lines are formed over, and insulated from, the diffused lines, crossing the diffused lines at right angles, with each conductive word line serving as the gates of a number of MOS transistors. Each transistor of the memory array is thus formed in a region having two continuous diffused lines and a single word line, with a single electrical contact to a bit line being formed for each such diffused line.

In order to reduce the capacitance between the diffused lines and the conductive (polycrystalline silicon) line, a thin layer of field oxide is produced over the diffused lines to isolate the diffused lines from the polycrystalline line. Furthermore, a thick layer of field oxide is generally required in the region between adjacent diffused lines and adjacent polycrystalline lines in order to isolate one memory cell from adjacent cells in order to minimize electric coupling between them.

The memory array is programmed by causing the threshold voltage of particular transistors to be increased, with respect to the other transistors, so that when a voltage is placed on the transistor's gate, a transistor with a lower threshold voltage will turn on, and thus conduct between its drain and source regions, indicating a logical "1", whereas a transistor with a higher threshold voltage will not conduct, indicating a logical "0". This programming is achieved by implanting the region of silicon between the diffused lines forming the source and drain regions of a selected transistor and below the polycrystalline line forming the gate of the selected transistor with an implant, for example of boron ions, to produce the required threshold voltage.

In U.S. Pat. No. 5,449,633, published on Sep. 12 1995, there is disclosed an alternate metal virtual ground (AMG) ROM array formed in a silicon substrate of P-type silicon. The array includes a ROM cell matrix which is defined by a plurality of rows and a plurality of columns of ROM data storage cells. The AMG ROM array includes a plurality of parallel, spaced-apart buried N+ bit lines formed in the silicon substrate. Alternate buried N+ bit lines are contacted by a conductive metal line at two contact locations within an array segment to thereby define contacted drain bit lines of the ROM cell matrix. Each buried N+ bit line that is between adjacent contacted drain bit lines is not contacted. Each non-contacted bit line is segmented into a length sufficient to form the segmented source bit line for a preselected plurality, for example 32 or 64, of ROM data storage cells, thereby defining a column of the ROM data storage cells in the ROM segment. That is, a first column of ROM data storage cells is connected between the segmented source bit line and the first adjacent contacted drain bit line. A second column of ROM data storage cells is connected between the segmented source line and the second adjacent contacted drain bit line. Each ROM segment thus consists of 32 or 64 cells, with each segment being isolated from each adjacent segment by field oxide regions and a segment select line is provided to select which particular ROM segment is to be read. The cells are programmed by implanting with boron ions, as described above, before the polycrystalline conducting line is formed over the N+ bit lines.

In each of the above two cases, therefore, large amounts of field oxide isolation are required to produce the ROM block. Such areas of field oxide isolation are undesirable because the process of growing field oxide layers causes the field oxide to eat into the active areas thereby reducing their size. In order to prevent this, the active areas must have a minimum spacing, thereby limiting increases in density.

In the first array described above, having one electrical metal contact line connected to each bit line means that there must be a relatively high density of metal lines on the chip, because and increasing the cell density would increase the density of the metal lines, which is very difficult to manufacture because the required masking and etching steps would need to produce very fine lines.

Furthermore, in the second array described above, the step of programming the cells takes place early on in the fabrication process, so that, for each different programming required, a relatively large amount of manufacturing must still be carried out after the programming is known and therefore the time taken to produce the finished product after the programming is known is still relatively high.

Thus, in order to produce denser ROM arrays, it would be desirable to reduce the number of metal contact lines required to read the data cells and to reduce the amount of field oxide required.

BRIEF SUMMARY OF THE INVENTION

The present invention therefore seeks to provide a ROM array which overcomes, or at least reduces the above-mentioned problems of the prior art.

Accordingly, in a first aspect, the invention provides a ROM array formed on a silicon substrate, the array being formed in a single active region bounded by one or more isolation regions formed in the substrate, the array being formed of one or more ROM banks, each ROM bank comprising a plurality of bit lines formed of substantially parallel regions of a first conductivity type formed in the silicon substrate, a plurality of word lines formed of substantially parallel conductive layers arranged on top of, and substantially perpendicular to, the plurality of bit lines, wherein adjacent portions of adjacent bit lines form source and drain electrodes of a data cell transistor with a portion of the word line extending between the adjacent portions of the bit lines forming a gate electrode of the data cell transistor, the ROM array further comprising isolation regions of a second conductivity type, opposite to the first conductivity type, formed between adjacent data cell transistors by implantation with dopant, and wherein selected data cell transistors are programmed by implanting with dopant a channel region between adjacent bit lines under the word line of the selected data cell transistors.

Preferably, the first conductivity type is of type N+ and the second conductivity type is of P+ type.

In one embodiment, the plurality of bit lines includes a first set of bit lines and a second set of bit lines, the bit lines of the first set alternating with the bit lines of the second set, and the array further comprising at least one row of contacts, each of the bit lines of the first set being coupled, directly or indirectly, to a respective contact, and each of the bit lines of the second set being selectively coupled to two adjacent contacts, being the contacts to which the adjacent bit lines of the first set are coupled to, first and second select lines extending over the row of bit lines, substantially parallel to the word line, for selectively coupling a transistor cell to be read into a path between two adjacent contacts by selecting the path from one contact via one bit line, the transistor cell and an adjacent bit line to the adjacent contact.

According to a second aspect of the invention, there is provided a ROM array comprising a plurality of pairs of bit lines and a plurality of contacts, a first bit line of a respective pair being coupled to a respective contact and a second bit line of the respective pair being selectively coupled to the same respective contact by means of a first select line, a word line extending substantially perpendicularly over the plurality of pairs of bit lines and forming transistor cells both between a pair of bit lines and between adjacent bit lines of adjacent pairs, and a second select line selectively coupling adjacent bit lines of adjacent pairs, wherein a transistor cell formed between the first and second bit lines of a particular pair can be read by the first select line being controlled such that the second bit line of the particular pair is not coupled to the respective contact and the second select line is controlled such that the second bit line of the particular pair is coupled to a first bit line of an adjacent pair, and wherein a transistor cell formed between a second bit line of a first pair and a first bit line of an adjacent pair can be read by the first select line being controlled such that the second bit line of the first pair is coupled to its respective contact and the second select line is controlled such that the second bit line of the first pair is not coupled to the first bit line of the adjacent pair via the second select line.

In a third aspect, the invention provides a ROM array comprising at least one row of bit lines including a first set of bit lines and a second set of bit lines, the bit lines of the first set alternating with the bit lines of the second set, and at least one row of contacts, each of the bit lines of the first set being coupled, directly or indirectly, to a respective contact, and each of the bit lines of the second set being selectively coupled to two adjacent contacts, being the contacts to which the adjacent bit lines of the first set are coupled to, a word line extending substantially perpendicularly over the row of bit lines and forming transistor cells between adjacent bit lines, first and second select lines extending over the row of bit lines, substantially parallel to the word line, for selectively coupling a transistor cell to be read into a path between two adjacent contacts by selecting the path from one contact via one bit line, the transistor cell and an adjacent bit line to the adjacent contact.

According to one embodiment, the first set of bit lines are directly connected to the contacts and the second set of bit lines are selectively coupled to the contacts by means of a select transistor formed by the first select line extending over the second set of bit lines and the row of contacts, each of the bit lines of the second set also being selectively coupled to an adjacent contact via a select transistor formed between the bit line of the second set and an adjacent bit line of the first set by the second select line extending thereover.

According to an alternate embodiment, the first set of bit lines are selectively coupled to the contacts of a first row by means of a select transistor formed by the first select line extending over the first set of bit lines and the first row of contacts and the second set of bit lines are selectively coupled to the contacts of the first row by means of a select transistor formed by the first select line extending over the second set of bit lines and the row of contacts, the array further comprising a second row of contacts with the corresponding contacts of the first and second rows of contacts being electrically connected together, wherein the first set of bit lines are selectively coupled to the corresponding contacts of the second row by means of a select transistor formed by the second select line extending over the first set of bit lines and the second row of contacts and the second set of bit lines are selectively coupled to contacts of the second row which are adjacent to the corresponding contacts by means of a select transistor formed by the second select line extending over the second set of bit lines and the second row of contacts.

According to a fourth aspect of the present invention, there is provided a method of manufacturing a ROM array on a silicon substrate, the method comprising the steps of:

providing a silicon substrate and producing at least one active area therein, which is isolated from other active areas on the substrate;

forming a plurality of substantially parallel bit lines of a first conductivity type in the substrate by forming a photoresist mask on the active area defining the plurality of bit lines and implanting a dopant into the substrate through the mask at a relatively high concentration;

forming a plurality of substantially parallel word lines on top of, and substantially perpendicular to, the plurality of bit lines, by growing a layer of oxide material, depositing a layer of polcrystalline silicon on the oxide material, doping the polycrystalline silicon to the required conductivity and then etching the polycrystalline silicon to define the word lines;

forming isolation regions between the bit and word lines by implanting a dopant at a low energy such that it cannot pass through the polycrystralline silicon forming the word lines and of a relatively low concentration such that it does not affect the higher concentration of dopant forming the bit lines;

programming selected transistors in the ROM array by forming a photoresist mask defining the areas of the word lines of selected transistors, and implanting dopant through the polycrystalline silicon of the defined areas so as to produce channel regions of the selected transistors having a predetermined conductivity different from the conductivity of the channel regions of the transistors which are not selected; and forming contacts and a passivation layer on the array.

In a preferred embodiment, the step of forming a plurality of word lines, comprises first depositing a first layer of polycrystalline silicon on the oxide material, then manufacturing other desired electronic circuitry on the silicon substrate outside the active area containing the ROM array and then depositing a second layer of polycrystalline silicon on top of the first layer of polycrystalline silicon, before doping to the required conductivity.

Preferably, before the step of programming selected transistors, a further step of fabricating other modules on the substrate, can be performed if desired.

In one embodiment, the step of programming selected transistors includes doping unwanted transistors in the array so as to form isolation areas in the array.

BRIEF DESCRIPTION OF THE DRAWINGS

One embodiment of the invention will now be more fully described, by way of example, with reference to the drawings, of which.

DETAILED DESCRIPTION OF THE DRAWINGS

Figure 1:
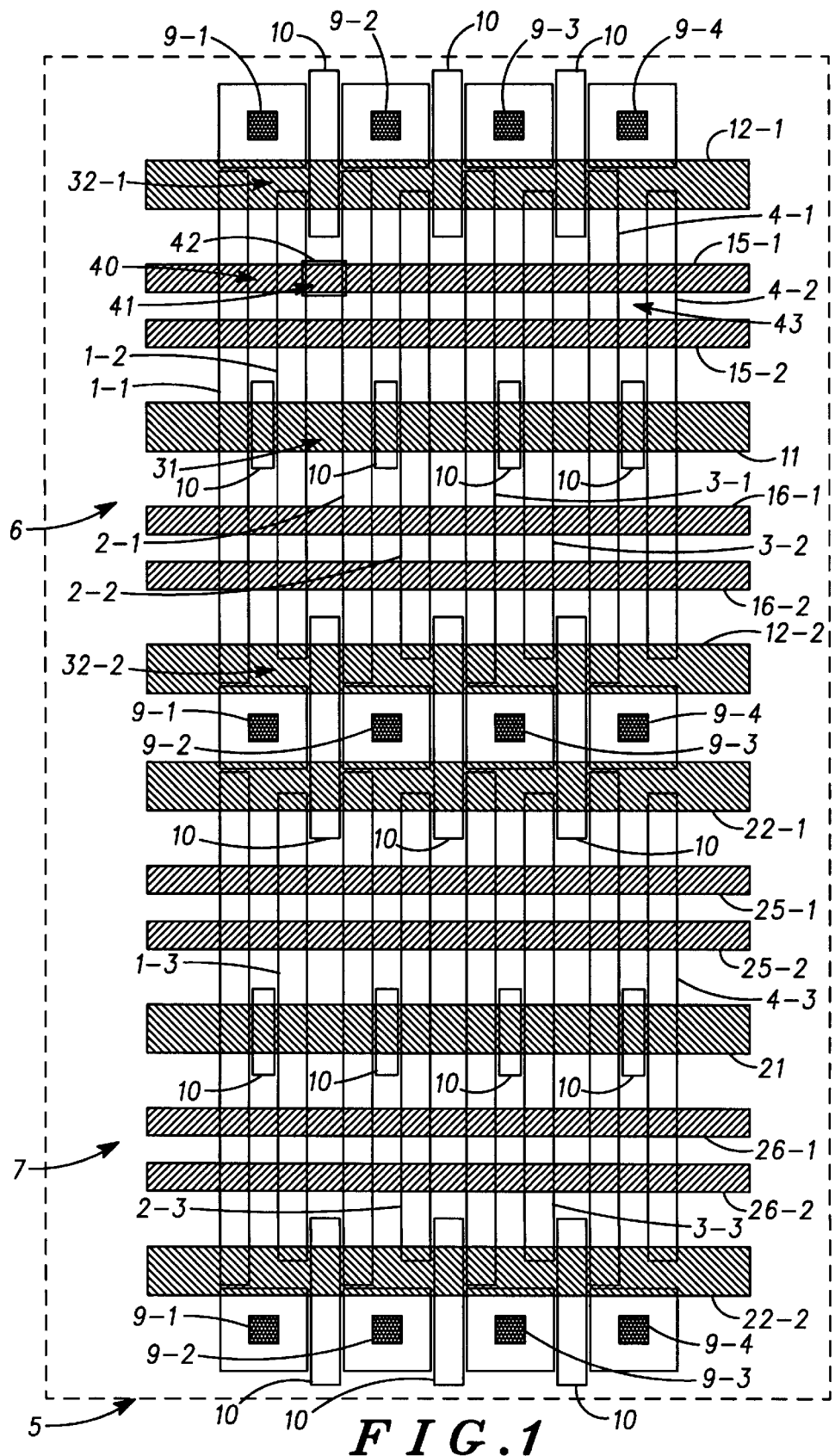
FIG. 1 shows the layout of a memory array constructed in accordance with a preferred embodiment of the present invention.

Thus, as shown in FIG. 1 a ROM array 5 according to one embodiment of the present invention includes two banks 6 and 7 of ROM cells. Each bank is separated by a row of contacts 9-1 through 9-4, each of which make electrical contact to a respective conductive metal line (not shown). It should be understood that any number of such banks can be put into the array. This array 5 is defined within a single piece of active area of silicon, which is isolated from other active areas by areas of field oxide.

Referring to the first bank 6 in the array shown in FIG. 1, the bank 6 consists of a plurality of pairs of substantially parallel continuous N+ diffused lines 1-1 and 1-2, 2-1 and 2-2, 3-1 and 3-2, 4-1 and 4-2. These columns of N+ diffused lines form the bit lines of the ROM array. It will, of course, be understood that more bit lines can be added in a similar way parallel to the bit lines shown. Running perpendicular to these bit lines are upper and lower sets of rows of word lines 15-1 and 15-2, 16-1 and 16-2, which are formed by polycrystalline silicon. The upper and the lower sets of rows are separated by a left-enable select line 11. The number of rows of word lines in the upper set and the lower bank can be eight or sixteen depending on the external logic design (not shown). In addition to the left-enable select line, right-enable select lines 12-1 and 12-2 are provided, which, together with the left-enable select line 11, form a switching mechanism with select transistors 31, 32-1 and 32-2 to select a ROM cell at the left or right hand side of a bit line. Both the left-enable select line and the right-enable select lines are also formed of polycrystalline silicon.

In the lower bank 7, there are shown left select line 21, right select lines 22-1 and 22-2, and upper and lower sets of rows of word lines 25-1 and 25-2, 26-1 and 26-2. In this lower bank 7, the left-hand bit lines 1-1, 2-1, 3-1 and 4-1, of each pair are connected between the middle and lower rows of contacts 9-1, 9-2, 9-3 and 9-4 and the right hand bit lines 1-3, 2-3, 3-3 and 4-3 are arranged parallel thereto, but not directly connected to the respective contacts.

Since the complete array is built within a single active region, there is no field oxide for isolation. To form the necessary isolation between the bit lines, all that is needed is for a dopant of opposite type to the N+ bit lines, for example, Boron, to be implanted in the array. This can be done by providing a layer of photoresist which opens the whole active area after the polycrystalline silicon word lines and the left-enable and the right-enable select lines have been fabricated. Boron is then implanted to the array with a relatively low energy of 30–40 keV and a relatively low dosage of $4\times10^{12}$ cm$^{-2}$ to $6\times10^{12}$ cm$^{-2}$. With this energy, only those areas with no polycrystalline silicon lines covering the substrate receive the dopant, since the energy is insufficient for the Boron ions to penetrate through the polycrystalline silcon. Furthermore, since the N+ bit lines are usually implanted at a dosage of $1\times10^{15}$ cm$^{-2}$ to $5\times10^{15}$ cm$^{-2}$ of Arsenic, the effective Boron dopant is bounded between the N+ bit lines and between polycrystalline lines to form the isolation, such as area 43. Thus, by producing isolation between the bit and word lines using dopant which is implanted after fabrication of the word and bit lines, the word and bit lines can be more densely arranged than in the prior art, where field oxide was required for such isolation.

A ROM cell transistor such as 40 is formed between two N+ bit lines 1-1 and 1-2, together with the polycrystalline silicon word line 15-1 running above a dielectric (not shown) and perpendicular to the bit lines. ROM code can be programmed to a cell, such as 41 by, for example, a layer of photoresist which opens a window to the cell 41 to be programmed. A dopant of opposite type to the N+ bit lines, such as Boron, can be implanted to the transistor cell through the polycrystalline silicon word line 15-1 using a relatively high energy of 160–190 keV with a relatively high dosage of $1\times10^{14}$ cm$^{-2}$ to $2\times10^{14}$ cm$^{-2}$, as shown at 42. Since the programming step involves doping the gate of the transistor cell to increase its threshold voltage, transistor cells formed by the left-enable select line and the right-enable select lines, which are not required, are also "programmed" by doping to have implant regions 10 at the same time as the ROM code programming step so as to avoid any unwanted current leakage during operation.

Before reading a cell, the bit lines are pre-charged. To read the cell 40, the word line 15-1 is brought high while the other word lines are kept low. Referring to the bit line 1-2, the cell 40 is on the left hand side of this bit line. Therefore, the left-enable select line 11 is turned on, while keeping the right-enable select lines 12-1 and 12-2 off. The conductive metal line connecting the contact 9-1 is then coupled to a sense-amplifier (not shown) and the metal line connecting the contact 9-2 is grounded while other metal lines are floating. If the cell is not programmed, current will flow from the contact 9-1, through the bit line 1-1, through the cell 40, through the bit line 1-2, passing the select transistor 31, going back to the contact 9-2 through the bit line 2-1. If the cell is programmed, no current will be detected by the sense-amplifier.

Similarly, to read the cell 41, the word line 15-1 is brought high while other word lines are kept low. The right-enable select lines 12-1 and 12-2 are then turned on. The conductive metal line connecting the contact 9-1 is switched to the sense-amplifier circuit. The metal line connecting the contact 9-2 is grounded while the other metal lines are kept floating. If the cell is not programmed, current will flow from the contact 9-1, passing the select transistor 32-1, through the bit line 1-2, through the cell 41, going back to the contact 9-2 through the bit line 2-1. If the cell is programmed, no current will be detected by the sense-amplifier.

It will thus be apparent that, with the design described above, only one metal line is required for every two bit lines, so that the ROM array can be made denser than in the prior art where one metal line was required for each bit line.

A process for fabricating the compact ROM in accordance with one embodiment of this invention will be now described. FIGS. 2 to 10 show the schematic diagrams of the process steps, which will be further described below.

Figure 2:
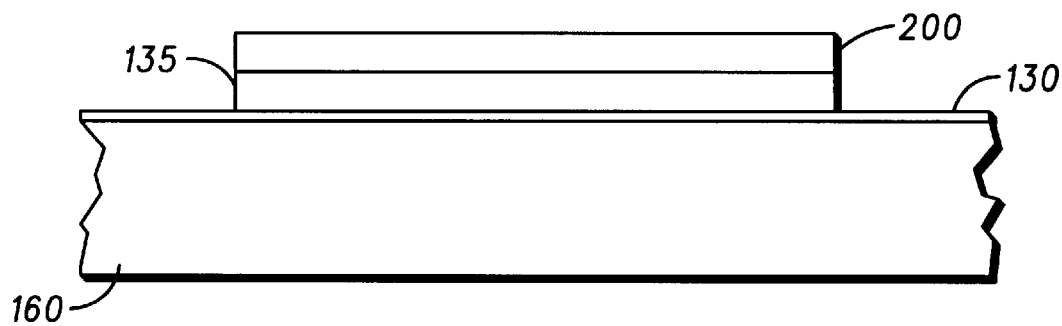
FIGS. 2–10 are cross-sectional views along a word line as well as a bit line depicting steps in the process of fabrication of the memory array in accordance with the preferred embodiment of the present invention.

Referring firstly to FIG. 2, the process starts with a P-type silicon substrate 160. A layer of pad oxide 130 of thickness 300–400 Å is grown on the substrate followed by a layer of silicon nitride 135 of thickness 1500–1600 Å. Well-known photolithography and etch techniques are used to define the active region with photoresist 200 and to remove the silicon nitride at the areas where field oxide is to be grown. Since there is no field oxide within the ROM array, the active region is a single piece of area with the field oxide surrounding it. After the field oxide 170 is grown, the silicon nitride 135, as well as the pad oxide 130, are removed.

Figure 3:
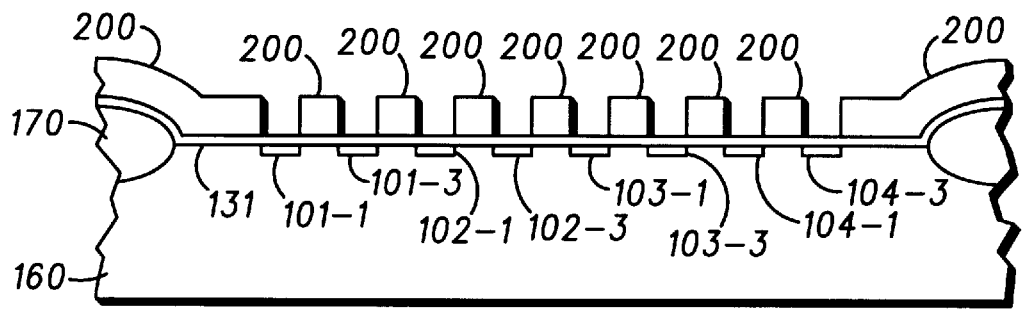
Figure 4:
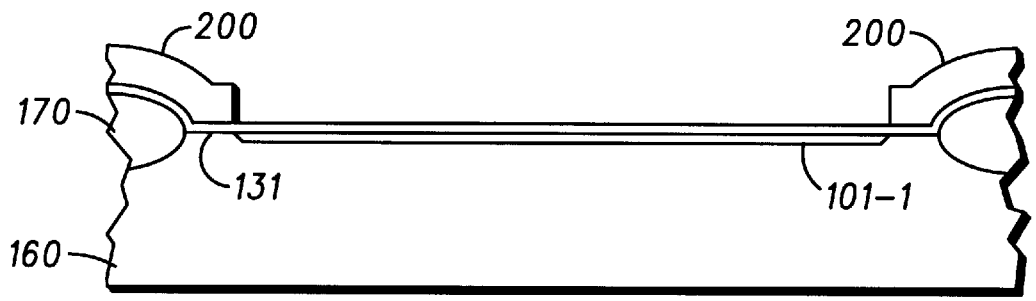

As shown in FIG. 3, an N+ bit line photoresist mask is then formed, using suitably etched photoresist 200, to define the bit lines 101-1 through 104-3. A dopant such as Arsenic with a dosage of $1 \times 10^{15}$ cm$^{-2}$ to $5 \times 10^{15}$ cm$^{-2}$ is then implanted in the substrate through a sacrificial oxide 131 to form the bit lines. It will be understood that any number of bit lines can be added in the array within the single piece of active region. As depicted in FIG. 4, which shows the cross-section along a bit line 101-1, the active area is open for the entire ROM array and the bit lines, such as 101-1, runs continuously from the first bank to the last bank. After forming the bit lines, the photoresist 200 is stripped and the sacrificial oxide 131 is removed.

Figure 5:
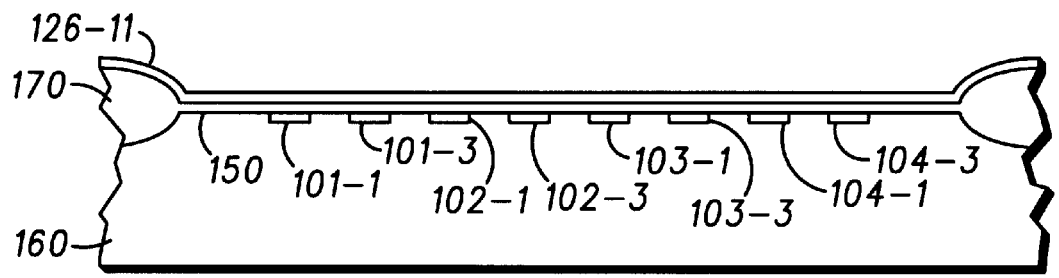
Figure 6:
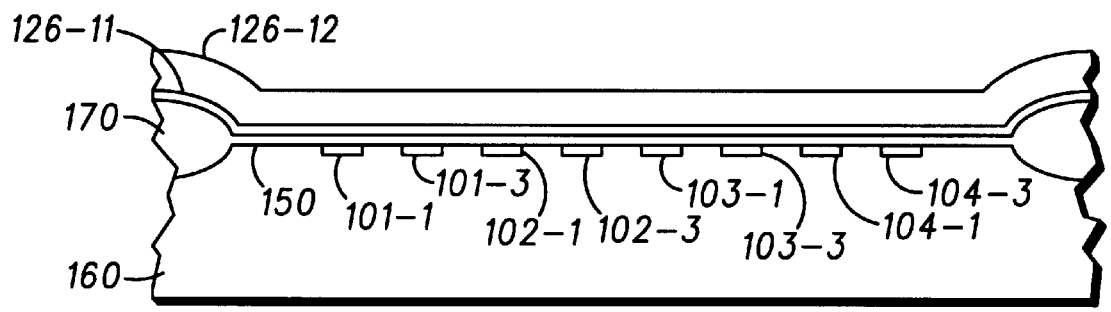

Since the active area is large, wafer cleaning before gate oxide growth is desirable to avoid defects. Furthermore, polycrystalline silicon should be deposited as soon as the gate oxide is grown so as to protect the gate oxide. As shown in FIG. 5, gate oxide 150 of thickness 100–250 Å is grown over the bit lines 101-1 through 104-3. A thin layer of polycrystalline silicon 126-11 of thickness 500–800 Å is then deposited. When used in a microcontroller embedded with both ROM and SRAM, additional modules such as buried contact patterns and etch steps are performed at this time. After finishing the additional modules, a second layer of polycrystalline silicon 126-12 of thickness 3200–3500 Å is deposited as shown in FIG. 6. The polycrystalline silicon is then doped in a well known manner to the required resistivity by, for example POC13, or by being implanted by a dopant such as Arsenic. Photolithography and etch steps are performed to define the word lines, the left-enable select line and the right-enable select lines which run substantially perpendicular to the N+ bit lines. The photoresist is then stripped.

Figure 7:
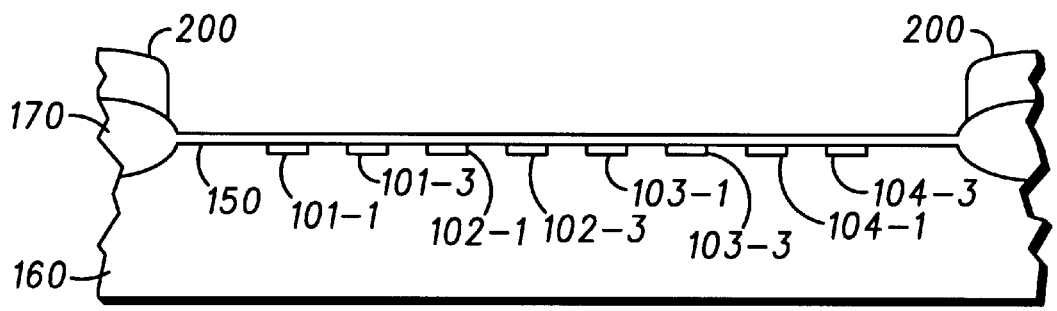

Since there is no field oxide to isolate the N+ bit lines, an isolation mask is then formed, as shown in FIG. 7, which opens the photoresist 200 on the entire ROM array in the active area. A dopant, such as Boron, is implanted with an energy 30–40 keV and a dosage of $4 \times 10^{12}$ cm$^{-2}$ to $6 \times 10^{12}$ cm$^{-2}$. With this energy, Boron cannot pass through the polycrystalline silicon word lines in the array which have a thickness of 3700–4300 Å. So only the substrate between the polycrystalline lines receives the dopant. Since the N+ bit lines have a dosage of $1 \times 10^{15}$ cm$^{-2}$ to $5 \times 10^{15}$ cm$^{-2}$, the effective Boron stays in the substrate region between the N+ bit lines. The photoresist is then stripped.

Subsequent masks are then formed to define the N+ and P+ source and drain regions. However, as there are no conventional transistors in the entire ROM array, these layers are only used for conventional transistors in the peripheral circuits.

Figure 8:
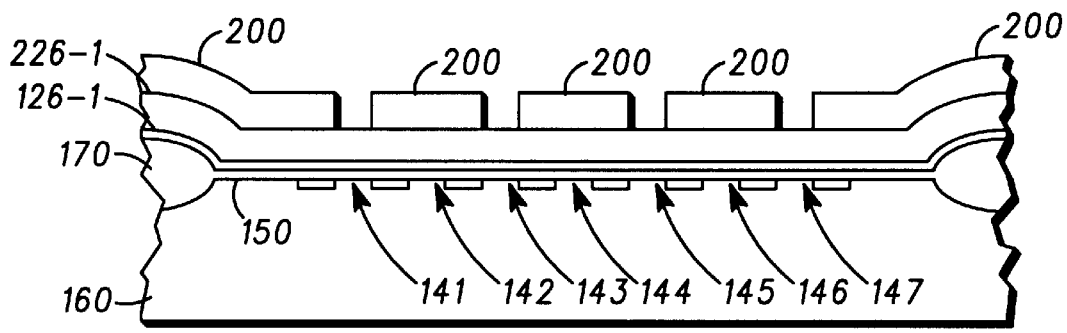

Referring now to FIG. 8, a ROM pattern mask is formed which programs the code in the array. The programming can be performed, for example, by opening a window in the photoresist to the cell to be programmed. A dopant such as Boron can be implanted to the transistor cells 141, 143, 145 and 147 through the polycrystalline silicon using an energy of 60–190 keV with a dosage of $1 \times 10^{14}$ cm$^{-2}$ to $2 \times 10^{4}$ cm$^{-2}$. This brings the threshold voltage of the programmed cells to a high state such as 5–6V. Unused transistors (as shown in FIG. 1) are also turned off at the same time using the code programming mask by forming implant regions 10 therein. Unprogrammed cells remain at a low state such as 0.7–0.8V. The photoresist is then stripped.

Figure 9:
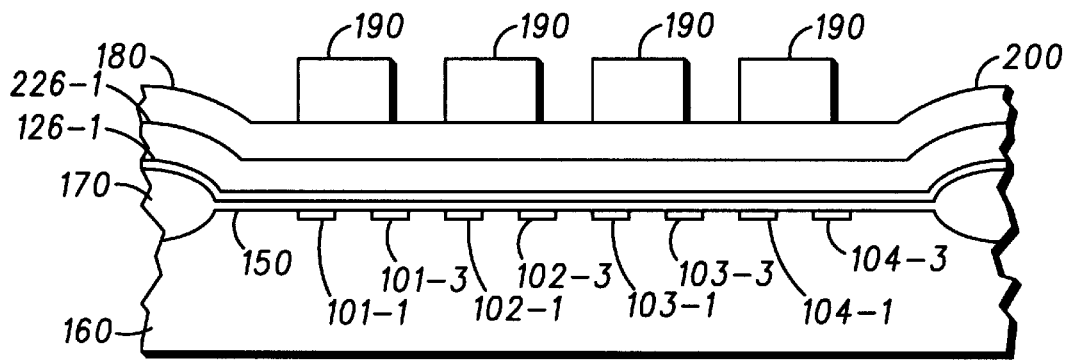
Figure 10:
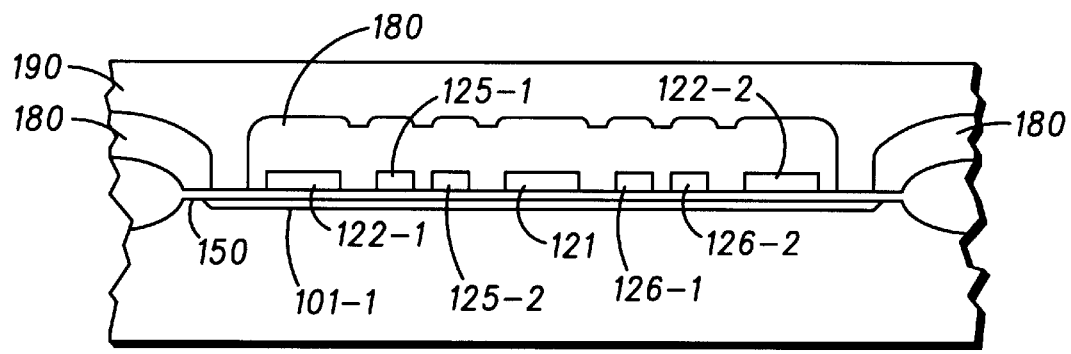

Subsequently, planarization by forming a layer of glass 180 and opening electrical contacts in the glass using well known techniques are performed. A layer of conductive metal 190 is then formed and patterned as shown in FIG. 9. These metal lines run in parallel with the N+ bit lines. As shown in FIG. 10, electrical contacts between the metal and N+ bit lines are formed at the ends of each bank which consists of the word lines 125-1 to 125-2 and 126-1 126-2, the left-enable select line 121 and the right-enable select lines 122-1 and 122-2. Finally, a layer of passivation (not shown) is formed in a well known manner.

Figure 11:
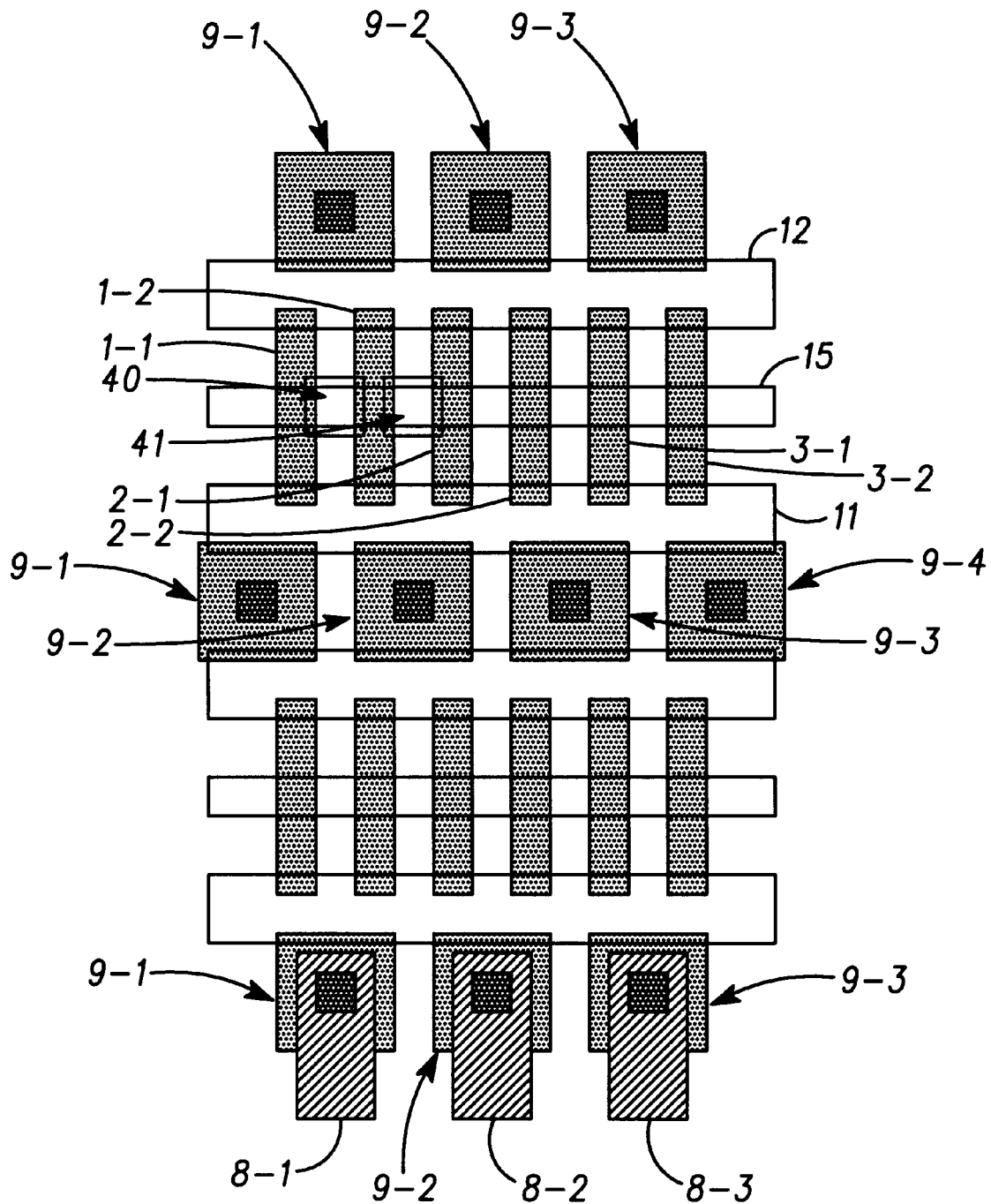
FIG. 11 shows a layout, similar to that of FIG. 1, of a memory array according to an alternate embodiment of the invention.

Turning now to FIG. 11, there is shown schematically a layout of a memory array according to an alternate embodiment of the invention, where similar elements to those of FIG. 1 have the same reference numerals. As can be seen, in this embodiment, only three contacts 9-1, 9-2, and 9-3 are shown in the top row of contacts and the bit lines 1-1, 2-1, and 3-1 are not directly connected to the respective contacts. Furthermore, the contacts 9-1, 9-2, 9-3 and 9-4 in the second row of contacts (in the middle of the drawing) are "offset" by one bit line with respect to the contacts in the top and bottom rows of contacts. Of course, as in the embodiment of FIG. 1, contacts 9-1 in each row are electrically connected together, as are contacts 9-2, etc. Each of the contacts 9-1, 9-2, 9-3, etc are connected to metal lines 8-1, 8-2, 8-3, etc, respectively.

Thus, the alternate bit lines 1-2, 2-2 and 3-2 are arranged adjacent the respective contacts 9-1, 9-2 and 9-3 in the top row, but adjacent contacts 9-2, 9-3 and 9-4, respectively, in the middle row. A right select line 12 extends over the bit lines and the top row of contacts and a left select line 11 extends over the bit line and the middle row of contacts, forming select transistors therebetween.

In order to read transistor cell 40, for example, the word line 15 is brought high. Referring to the bit line 1-2, the cell 40 is on the left hand side of this bit line. Therefore, the left-enable select line 11 is turned on, while keeping the right-enable select line 12 off. The conductive metal line connecting the contact 9-1 is then coupled to a sense-amplifier (not shown) and the metal line connecting the contact 9-2 is grounded while other metal lines are floating. If the cell is not programmed, current will flow from the contact 9-1 in the middle row of contacts, through the select transistor formed by left select line 11 and contact 9-1 in the middle row of contacts, through the bit line 1-1, through the cell 40, through the bit line 1-2, passing the select transistor formed by select line 11 and contact 9-2 in the middle row of contacts, going back to the contact 9-2. If the cell is programmed, no current will be detected by the sense-amplifier.

Similarly, to read the cell 41, the word line 15 is brought to high and the right-enable select line 12 is turned on. The conductive metal line connecting the contact 9-1 is switched to the sense-amplifier circuit. The metal line connecting the contact 9-2 is grounded while the other metal lines are kept floating. If the cell is not programmed, current will flow from the contact 9-1, passing the select transistor formed by right select line 12 and contact 9-1 in the upper row of contacts, through the bit line 1-2, through the cell 41, through the bit line 2-1, passing the select transistor formed by right select line 12 and contact 9-2 in the upper row of contacts, going back to the contact 9-2. If the cell is programmed, no current will be detected by the sense-amplifier.

Thus, the use of appropriate logic circuitry to control the appropriate select lines enables two transistor cells in the ROM array to be read for every one contact and metal line required.

It will also be apparent that the programming step in the manufacturing process is carried out after the bit and word lines have been fabricated. Therefore, the manufacturing time required to complete manufacture of a ROM array after the ROM code is programmed into the array is shorter than hitherto, where the transistor cells must be programmed before the word lines of polycrystalline silicon are fabricated. This reduction in manufacturing time is particularly important when errors are found in the ROM code after manufacture and new code must be programmed and tested. In the past, each such new version of the ROM code programmed into the array would still require a relatively large amount of processing in order to fabricate the word lines and the final stages of the manufacturing process. In the embodiments of the invention described above, wafers of ROM arrays manufactured through to the stage where bit and word lines have been fabricated can be stored awaiting the ROM code, which can be programmed into the array, subsequently only requiring the final stages of the manufacturing process to be completed.

It will be appreciated that although only two particular embodiments of the invention have been described in detail, various modifications and improvements can be made by a person skilled in the art without departing from the scope of the present invention.

I claim:

1. A ROM array formed on a silicon substrate having at least one active region bounded by at least one first isolation region, the array comprising at least on ROM bank formed in a single active region, the ROM bank comprising a plurality of bit lines having at least first ends and formed of substantially parallel regions of a first conductivity type formed in the silicon substrate, a plurality of word lines formed of substantially parallel conductive layers extending substantially peripendicularly to the bit lines, wherein data cell transistors in the ROM bank are at least partially formed by portions of word lines expending between adjacent bit lines, each data cell transistor having control electrode formed by the portion of the word line and a pair of current electrodes formed by portions of the bit lines adjacent the portion of the word line, the data cell transistors being isolated from each other by second isolation regions of a second conductivity type opposite to the first conductivity type formed by implantation with dopant, selected ones of the data cell transistors being programmed by having a channel region between their current electrodes implanted with dopant to change their conductivity, the ROM bank further comprising a plurality of contacts adjacent the first ends of the plurality of bit lines, a contact select line formed of a conductive layer and at least partially overlapping the first ends of the bit lines and the plurality of contacts and a bit select line formed of a conductive layer and at least partially overlapping the bit lines, and third isolation regions of the second conductivity type being formed by dopant implantation between adjacent contacts, wherein desired data cell transistors can be selected by enabling either the contact select line or the bit select line.

2. A ROM array according to claim 1, wherein the first conductivity type is of type N+ and the second conductivity type is of P+ type.

3. A ROM array according to claim 2, wherein the second conductivity type is formed by implantation with Boron ions.

4. A ROM array according to claim 1, wherein the first isolation regions bounding the one or more active regions are formed of field oxide.

5. A ROM array according to claim 1, wherein the word lines are formed of polycrystalline silicon.

6. A ROM array according to claim 5, wherein the polycrystalline silicon forming the word lines is deposited on a layer of gate oxide grown on the silicon substrate over the bit lines.

7. A ROM array according to claim 1, wherein the second isolation regions are formed by implantation with relatively low energy Boron ions.

8. A ROM array according to claim 1, wherein the selected data cell transistors are programmed by implantation with relatively high energy Boron ions.

9. A ROM array according to claim 1, wherein the third isolation regions are formed by implantation with relatively high energy Boron ions.

10. A ROM array according to claim 1, wherein the plurality of bit lines includes pairs of bit lines, each associated with a respective contact, each pair having a first bit line and a second bit line, the first bit lines alternating with the second bit lines the first ends of each of the first bit lines being coupled to the respective contact, and first ends of each of the second bit lines being selectively coupled to the respective contact, wherein a desired data cell transistor can be selected by enabling either the contact select line or the bit select line to provide a conductive path between two adjacent contacts by selecting the path from one contact via one bit line, the desired data cell transistor and an adjacent bit line to an adjacent contact.

11. A ROM array according to claim 1, wherein the bit lines include second ends and the ROM bank further comprises:

a further plurality of contacts adjacent the second ends of the plurality of bit lines, each contact adjacent a second end of a bit line being electrically coupled to the contact adjacent the first end of that bit line; and a further contact select line formed of a conductive layer and at least partially overlapping the second ends of the bit lines and the further plurality of contacts.

12. A ROM array according to claim 10, wherein the third isolation regions extend between adjacent second and first bit lines of adjacent pairs of bit lines under the contact select line.

13. A ROM array according to claim 10, further comprising fourth isolation regions of the second conductivity type formed by dopant implantation between the first and second bit lines of each pair under the bit select line.

14. A ROM array according to claim 12, wherein the third isolation regions are formed by implantation with relatively high energy Boron ions.

15. A ROM array according to claim 13, wherein the fourth isolation regions are formed by implantation with relatively high energy Boron ions.

16. A ROM array according to claim 15, wherein the third and fourth isolation regions are formed in a single implantation step with relatively high energy Boron ions.

* * * * *